(12) United States Patent
Sridharan et al.

(10) Patent No.: US 10,370,290 B2
(45) Date of Patent: Aug. 6, 2019

(54) PASSIVATION GLASSES FOR SEMICONDUCTOR DEVICES

(71) Applicant: Ferro Corporation, Mayfield Heights, OH (US)

(72) Inventors: Srinivasan Sridharan, Strongsville, OH (US); John J. Maloney, Solon, OH (US); George E. Sakoske, Independence, OH (US); Gregory R. Prinzbach, Brecksville, OH (US); David Widlewski, Parma Heights, OH (US); Jackie Davis, Cleveland, OH (US); Bradford Smith, North Ridgeville, OH (US)

(73) Assignee: Ferro Corporation, Mayfield Heights, OH (US)

(*) Notice: Subject to any disclaimer, the term of this patent is extended or adjusted under 35 U.S.C. 154(b) by 0 days.

(21) Appl. No.: 16/075,796

(22) PCT Filed: May 3, 2017

(86) PCT No.: PCT/US2017/030788
§ 371 (c)(1),
(2) Date: Aug. 6, 2018

(87) PCT Pub. No.: WO2018/026402
PCT Pub. Date: Feb. 8, 2018

(65) Prior Publication Data
US 2019/0055155 A1      Feb. 21, 2019

Related U.S. Application Data

(60) Provisional application No. 62/370,294, filed on Aug. 3, 2016.

(51) Int. Cl.
| | | |
|---|---|---|
| H01L 21/02 | (2006.01) |
| C03C 4/16 | (2006.01) |
| C03C 3/066 | (2006.01) |
| C03C 8/24 | (2006.01) |
| H01L 23/29 | (2006.01) |
| H01L 23/31 | (2006.01) |
| C03C 3/062 | (2006.01) |
| C03C 3/108 | (2006.01) |
| C03C 3/072 | (2006.01) |
| C03C 8/04 | (2006.01) |
| C03C 8/10 | (2006.01) |
| C03C 8/22 | (2006.01) |

(52) U.S. Cl.
CPC ............... *C03C 4/16* (2013.01); *C03C 3/062* (2013.01); *C03C 3/066* (2013.01); *C03C 3/072* (2013.01); *C03C 3/108* (2013.01); *C03C 8/04* (2013.01); *C03C 8/10* (2013.01); *C03C 8/22* (2013.01); *C03C 8/24* (2013.01); *H01L 21/02112* (2013.01); *H01L 23/291* (2013.01); *H01L 23/3171* (2013.01); *C03C 2204/00* (2013.01); *C03C 2205/00* (2013.01)

(58) Field of Classification Search
CPC ......... H01L 21/02109; H01L 21/02225; H01L 21/02227; H01L 21/0226; H01L 21/02296; H01L 21/02518; H01L 29/68; H01L 29/70
See application file for complete search history.

(56) References Cited

U.S. PATENT DOCUMENTS

| | | |
|---|---|---|
| 3,241,010 A | 3/1966 | Eddleston |
| 4,133,690 A | 1/1979 | Muller |
| 4,201,598 A | 5/1980 | Tanaka et al. |
| 6,255,239 B1 | 7/2001 | Sakoske |
| 6,743,743 B2 | 6/2004 | Sato |
| 7,569,505 B2 | 8/2009 | Besinger et al. |
| 8,163,392 B2 | 4/2012 | Besinger et al. |
| 8,486,536 B2 | 7/2013 | Zou et al. |
| 8,772,189 B2 | 7/2014 | Singh et al. |
| 8,895,843 B2 | 11/2014 | Carroll et al. |
| 8,945,713 B2 | 2/2015 | Satou et al. |
| 9,099,483 B2 | 8/2015 | Muyari et al. |
| 9,871,176 B2 | 1/2018 | Maloney et al. |
| 10,047,004 B2 | 8/2018 | Sakoske et al. |
| 10,069,020 B2 | 9/2018 | Carroll et al. |
| 2014/0026619 A1 | 1/2014 | Maloney et al. |

(Continued)

FOREIGN PATENT DOCUMENTS

CN     105502926 A     4/2016

OTHER PUBLICATIONS

Obreja "The PN Junction Passivation Process and Performance of Semiconductor Devices." pp. 287-292, 30th ISSE (2007).

(Continued)

*Primary Examiner* — Cheung Lee
(74) *Attorney, Agent, or Firm* — Rankin, Hill & Clark LLP

(57) ABSTRACT

A passivation glass coating composition is provided for forming a fired passivation glass layer on a semiconductor substrate having p-n junction. The passivation glass coating composition includes a glass component that is lead free, cadmium free, alkali metal oxides free, and colored transition metal oxides (i.e. metal oxides of V, Fe, Co, Ni, Cr, Cu, Mn) free. The glass component includes bismuth based glasses, and provides a firing temperature range of 500° C. to 900° C., and controlled devitrification. Once fired to a semiconductor device, the fired passivation glass layer provides exceptional device performance including no cracking of the fired passivation glass layer, excellent thermal expansion matching to silicon, good chemical resistance to acid and base, and improved device performance.

20 Claims, 8 Drawing Sheets

(56) References Cited

U.S. PATENT DOCUMENTS

2018/0186687 A1    7/2018  Sridharan et al.

OTHER PUBLICATIONS

Hoex et al., "On the c-Si surface passivation mechanism by the negative-charge-dielectric Al2O3," Journal of Applied Physics 104, pp. 113703-1-113703-7, 2008.
Shimbo et al., "Surface Charge Studies on Lead Borosilicate Glass Containing Trace Sodium," J. Electrochem Soc.: Solid-State Science and Technology, Jan. 1987, pp. 156-160.
International Search Report for corresponding PCT/US2017/030788 dated Aug. 17, 2017, one page.
Espacenet bibliographic data for CN105502926 published Apr. 20, 2016, one page.

PASSIVATION GLASSES FOR SEMICONDUCTOR DEVICES

FIELD

The present subject matter relates to passivation glasses used in semiconductor devices, methods of applying passivation glasses to semiconductor devices, and semiconductor devices including fired passivation glass layers.

BACKGROUND

Semiconductor devices primarily based on silicon, such as transistors, diodes, thyristors, and rectifiers, typically include a p-n junction between the p-type semiconductor and the n-type semiconductor. The p-n junction is subjected to higher voltage in reverse bias. At certain voltages, reverse leakage current becomes excessive and the device fails. The main contributor to the reverse leakage current of the p-n junction, is the surface leakage current occurring at the defects on the surface (i.e. periphery) of the p-n junction, especially at elevated operating temperatures and at elevated device voltages. Therefore, semiconductor devices often utilize a passivation layer covering the periphery of the p-n junction to provide low leakage current therefrom. In passivated p-n junctions, leakage current occurring at the interface layer between the passivation layer and silicon also contributes to the reverse leakage current.

Many conventional passivation techniques employ lead based glasses. However, lead is environmentally unfriendly and therefore undesirable. Although lead free ZnO—$B_2O_3$—$SiO_2$ glasses have been advanced for high voltage devices, these glasses suffer from several difficulties, such as higher firing temperatures, excessive devitrification (i.e. crystallization of zinc-borates) causing insufficient negative surface charge density, and sometimes disadvantageously requiring the addition of some heavier alkali oxides, such as $Cs_2O$, in order to fire at desired lower temperatures. Since alkali ions from these heavier alkali oxides can move across a thin layer of glass under high electric field during the application of high voltage, this movement of ions could cause instability for high voltage devices.

As such, there is a need to eliminate lead from these glasses for environmental reasons. There is also a need to provide reduction resistant passivation glasses when fired on semiconductors such as silicon and silicon carbide. Accordingly, there exists a need for improved compositions for passivation glasses that address the shortcomings of the previous passivation techniques.

SUMMARY

The difficulties and drawbacks associated with previously known systems are addressed in the present compositions, methods, and assemblies.

The present subject matter provides suitable bismuth based glasses that are lead free, cadmium free, alkali metal oxides free, and colored transition metal oxides (i.e. metal oxides of V, Fe, Co, Ni, Cr, Cu, Mn) free.

The bismuth based glasses are used as single frit or mixtures of multiple frits and optionally combined with one or more fillers to be used as a glass component in a passivation glass coating composition. The passivation glass coating composition can include a vehicle to enable liquid or paste deposition techniques and possibly improve dispersion or other properties, and is applied to and fired over the periphery of p-n junctions in semiconductor devices to form a passivation glass layer. The passivation glass layer is used to passivate the p-n junction in the semiconductor devices. The passivation glass coating composition including the bismuth based glass component, provides a firing temperature range of 500° C. to 950° C., and controlled devitrification during firing. The fired passivation glass layer provides exceptional device performance including no cracking of the passivation glass layer, excellent thermal expansion matching to silicon, good chemical resistance to acid and base, and improved device performance.

This present subject matter also includes various methods of application, various passivation structures and stacks (i.e. a stack of multiple fired passivation glass layers), and various semiconductors including silicon substrates comprising the fired passivation glass layers.

In one aspect, the present subject matter provides a semiconductor device comprising of a semiconductor including a p-n junction, and a passivation glass layer fired on the semiconductor and covering a periphery of the p-n junction. Prior to firing, the fired passivation glass layer includes a glass component comprising: 5-56 mole % $Bi_2O_3$, 15-60 mole % ZnO, 0.1-43 mole % $B_2O_3$, 0.1-15 mole % $Al_2O_3$, 4-53 mole % $SiO_2$, and 1.5-43 mole % total $R_2O_3$, wherein R represents trivalent ions comprising, or selected from the group consisting of, $B^{3+}$, $Al^{3+}$, $La^{3+}$, $Y^{3+}$, $Ga^{3+}$, $In^{3+}$, $Sc^{3+}$, and lanthanide ions from $Ce^{3+}$ to $Lu^{3+}$, and excluding the color producing transition metals $Mn^{3+}$, $Fe^{3+}$, $Cr^{3+}$, $Co^{3+}$, $V^{3+}$.

In another aspect, the present subject matter also provides method of passivating a p-n junction, including: A) providing a coating composition including a glass component comprising, prior to firing, 5-56 mole % $Bi_2O_3$, 15-60 mole % ZnO, 0.1-43 mole % $B_2O_3$, 0.1-15 mole % $Al_2O_3$, 4-53 mole % $SiO_2$, and 1.5-43 mole % total $R_2O_3$, wherein R represents trivalent ions comprising, or selected from the group consisting of, $B^{3+}$, $Al^{3+}$, $La^{3+}$, $Y^{3+}$, $Ga^{3+}$, $In^{3+}$, $Sc^{3+}$, and lanthanide ions from $Ce^{3+}$ to $Lu^{3+}$, and excluding the color producing transition metals $Mn^{3+}$, $Fe^{3+}$, $Cr^{3+}$, $Co^{3+}$, $V^{3+}$; B) applying the coating composition to a periphery of a p-n junction; and C) firing the coating composition to thereby form a fired passivation glass layer on the periphery of the p-n junction.

As will be realized, the subject matter described herein is capable of other and different embodiments and its several details are capable of modifications in various respects, all without departing from the claimed subject matter. Accordingly, the drawings and description are to be regarded as illustrative and not restrictive.

DETAILED DESCRIPTION OF THE EMBODIMENTS

Figure 1:
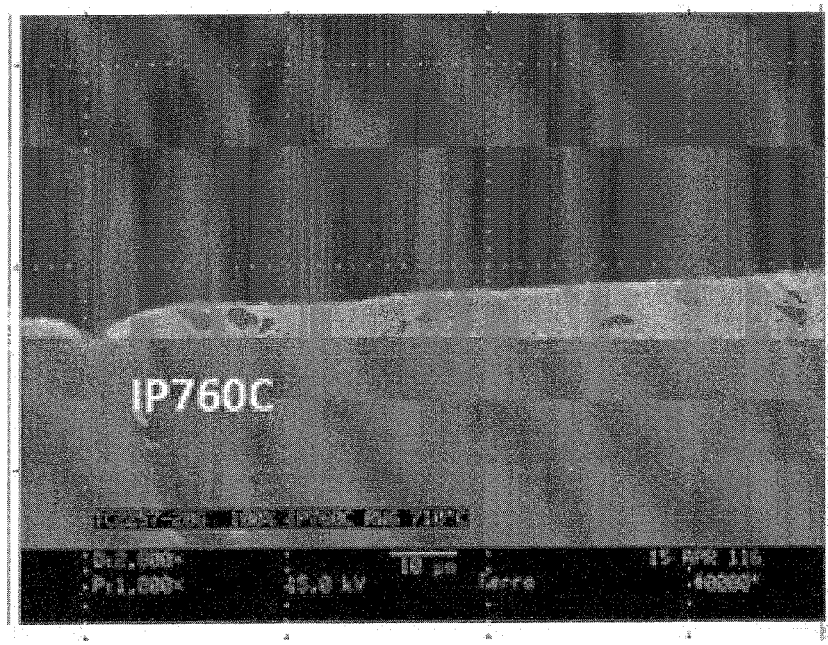
FIG. 1 is an SEM picture in cross-section of a prior art lead passivation glass layer that has been fired on a silicon wafer at 710° C.

The present subject matter provides glass frits, passivation glass components, passivation glass coating compositions, fired passivation glass layers, and related strategies to reduce the amount of reverse leakage current from predominantly silicon-based semiconductor devices that include p-n junctions.

In developing the instant passivation glass coating compositions, several considerations were taken into account. In this regard, a first level of passivation was pursued by reducing or eliminating the defect density in the silicon at the periphery of p-n junction, as well as at the interface between silicon and fired passivation glass layer.

Defects at the interface between the silicon and a typical fired passivation glass layer can occur, for example, from cracking due to thermal expansion mismatches between the fired passivation glass layer and the silicon; from excessive reduction of PbO during firing of lead-based glass coating compositions, thereby forming Pb metal in a continuous metal layer; from unwanted crystallization within the fired passivation glass layers producing a large thermal expansion mismatch between these crystals and silicon compared to the thermal expansion difference between the fired passivation glass layer and silicon, as well as between these crystals and the remaining/residual glass phase in the fired passivation glass layer; or from unwanted reactivity between the fired passivation glass layer and silicon that goes beyond that needed for good bonding, thereby forming an unwanted interfacial layer between the silicon and passivation glass layer producing a larger thermal expansion mismatch and cracking. Also, excessive reaction of silicon with a lead-based passivation glass layer might lead to precipitation and growth of a continuous lead metal layer at the interface. With respect to these considerations, prior lead glasses and lead free zinc glasses have several deficiencies.

Therefore, in order to reduce the defect density at the interface between silicon and the fired passivation glass layer and to address the above considerations, the passivation glass coating composition is formulated so that at this interface, there is a reduction or elimination of voids between the fired passivation glass layer and silicon, a reduction or elimination of cracking of the fired passivation glass layer, a reduction or elimination of formation of connected metal colloids, a reduction in the concentration of colored transition metal ions (i.e. metal ions of V, Fe, Co, Ni, Cr, Cu, Mn) where conduction can take place by charges hopping from one transition metal ion to the next, and a reduction or elimination of a concentration of alkali metal ions, which can physically move and transfer charges under an applied electric field.

In order to minimize residual stresses at the silicon/fired passivation glass layer interface and thereby minimize voids and cracking, which leads to stress assisted diffusion of charges and unwanted leakage current, the coefficient of thermal (CTE) expansion of the fired passivation glass layer should be close to that of silicon, which from ambient temperature (i.e. about 20° C.) to about 725° C., is $25.7 \times 10^{-7}/°$ C. to $43.3 \times 10^{-7}/°$ C. Accordingly, in one embodiment, the fired passivation glass layer has an overall coefficient of thermal expansion of less than $60 \times 10^{-7}/°$ C., preferably less than $50 \times 10^{-7}/°$ C., more preferably less than $45 \times 10^{-7}/°$ C., and most preferably less than $40 \times 10^{-7}/°$ C., in order to minimize residual stresses at this interface.

However, fired passivation glass layers having these lower thermal expansion coefficients normally require higher firing temperatures of more than 700° C., in most cases more than 800° C., and even more than 900° C. Yet, lower firing temperatures are desired as much as possible, such as less than 700° C., so as not to disturb the p-n junction structure (junction voltage, depletion layer thickness, or movement of defect pinning dislocations). Lower firing temperatures, such as 400-500° C., may also present a problem, such as in those cases where the glass transition temperature (Tg) of the fired passivation glass layers might be 250-350° C., which would undesirably limit the maximum operating temperatures of the semiconductor devices. This may present a problem when higher operating temperatures are desired. Typically, the maximum permissible operating temperature is 150-200° C. due to insufficiency in junction passivation at higher temperatures. In order to allow for higher operating temperatures without failure of the device, in several embodiments the fired passivation glass layer has a Tg greater than 350° C., and preferably greater than 400° C., but less than 550° C. or less than 500° C., to keep the firing temperatures at about 500-950° C., more preferably 600-950° C. to protect the silicon substrate.

In order to attain the desired firing temperature range, high $Bi_2O_3$ glasses were considered, with additions of cordierite fillers to reduce overall expansion. However, although these glass components can be fired in the desired temperature regions on silicon, they have serious deficiencies such as excessive reactivity with silicon, uncontrolled bismuth metal precipitation at the interface between silicon and the fired passivation glass layer, interfacial cracking, and sometimes crystallization of undesired crystals.

Therefore, in order to prevent the formation of metal colloids at the interface between the fired passivation glass layer and silicon, which could result in the formation of an interconnected metal layer that degrades electrical properties of the semiconductor devices, the passivation glass coating compositions were formulated to inhibit the formation of metal colloids by regulating the amount of $Bi_2O_3$.

In order to inhibit colored transition metal ion (i.e. ions of V, Fe, Co, Ni, Cr, Cu, Mn) concentration at the interface between silicon and the fired passivation glass layer so as to prevent conduction occurring by charges hopping from one transition metal ion site to the next, the passivation glass coating compositions were formulated to be free of colored transition metal oxides (i.e. oxides of V, Fe, Co, Ni, Cr, Cu, Mn).

In order to inhibit alkali metal ion concentration at the interface between silicon and the fired passivation glass layer so as to prevent the movement and transfer of charges under high applied electric field, the passivation glass coating compositions were formulated to be free of alkali metal oxides.

A second level of passivation is accomplished in the present subject matter by providing an appropriate surface charge density for the fired passivation glass layer (i.e. dielectric layer) that is used on these p-n junctions grown in typical p+/n/n+ configuration. The effective charge density (namely, the negative or positive charges per unit volume) of the fired passivation glass layer can lead to a reduction or increase in surface recombination of holes and electrons across the p-n junction along the outer periphery of the p-n junction that is covered by fired passivation glass layer. In general overall negative charge of the fired passivation glass layer may reduce the reverse leakage current across the p-n junction for the typical p+/n/n+ configuration. By tailoring the glass component, the negative charge of the fired passivation glass layer can be adjusted to reduce the reverse leakage current across the p-n junction.

Replacement of lead passivation glasses can be typically focused on barium glasses or zinc glasses, or bismuth glass as predominant (or in combination) glass systems.

Typical barium rich glasses were considered because barium has an ionic charge similar to lead ($Ba^{2+}$ vs $Pb^{2+}$), however, barium rich glasses tend to have higher thermal expansion coefficients that do not match well with silicon, and also fire at higher temperatures than desired, i.e. over 850° C. In smaller amounts, alkaline earth metal ions ($Ba^{2+}$, $Sr^{2+}$, $Ca^{2+}$, or $Mg^{2+}$) can affect the net surface charge density in other passivation glass systems due to the movement of these divalent ions under high electric field existing when high voltages are applied across a thin fired passivation glass layer.

Typical zinc rich glasses have been considered for lead free passivation glass coating compositions because replacing $Pb^{2+}$ by $Zn^{2+}$ gives the possibility of not excessively disturbing charge density. However, these conventional glasses contain higher amounts of ZnO (about 60 wt %) and $B_2O_3$ (20-30 wt %), compared to the amount of $SiO_2$ (5-15 wt %). Therefore these zinc rich glasses may undesirably crystallize zinc borates upon firing, which could deplete the fired passivation glass layer of $B^{3+}$ ions, and thus prevent an adequate negative surface charge density in the fired passivation glass layer. Also, typical zinc rich glasses usually contain minor amounts (e.g. up to 5 wt %) of PbO, $Sb_2O_3$, $CeO_2$, $SnO_2$, $MoO_3$, and $Bi_2O_3$. It is not clear whether these minor component oxides contributed to passivation or not.

Moreover, these glasses typically have up to 6 wt % $Cs_2O$, which is an alkali metal oxide and thus not desirable because the $Cs^+$ ions can physically move and transfer charges under high applied electric field, and NiO, which is a colored transition metal oxide and is not desirable because the Ni ions allow for conduction to occur by charges hopping from one transition metal ion site to the next.

Bismuth rich glasses were considered because Bi and Pb elements are next to each other in the periodic table. Therefore, their ions tend to be similar in sizes and hence similar melting temperatures and glass flow behaviors. However, handling differences in electronic charges of $Pb^{2+}$ and $Bi^{3+}$ ions produce a different surface charge density and could deter the use of bismuth passivation glasses. Furthermore, bismuth glasses contain high amount of $Bi_2O_3$, which as discussed herein, can be reduced by silicon on reaction and undesirably result in metallic bismuth precipitation at the interface between the silicon and fired passivation glass layer. Additionally, bismuth glasses sometimes contain substantial amounts of $Ta_2O_5$ (3-10 mass %) and $CaF_2$ (10-15 mass %) for lead free passivation, where the pentavalent $Ta_2O_5$ can reduce the negative surface charge density in these fired passivation glass layers.

Therefore, with these considerations in mind and in order to provide an appropriate surface charge density for the fired passivation glass layer, the passivation glass coating compositions are formulated to have specific ratios of trivalent ions to $Si^{4+}$, and specific ratios of trivalent ions to $Zn^{2+}$. In one embodiment, the molar ratio of $(B_2O_3+Al_2O_3)/SiO_2$ is preferred to be 0.1-9.0, and more preferred is 0.1-1.2. In another embodiment the molar ratio of $R_2O_3/SiO_2$, wherein R represents trivalent ions excluding color producing transition metals such as $Mn^{3+}$, $Fe^{3+}$, $Cr^{3+}$, $Co^{3+}$, $V^{3+}$, and most often includes $B^{3+}$, $Al^{3+}$, $La^{3+}$, $Y^{3+}$, $Ga^{3+}$, $In^{3+}$, $Sc^{3+}$, and lanthanide ions from $Ce^{3+}$ to $Lu^{3+}$, is preferred to be 0.1-15, and more preferred to be 0.1-2.0. In yet another embodiment the molar ratio of $(B_2O_3+Al_2O_3)/ZnO$ is preferred to be ≤5.0, more preferred to be ≤3.0, and most preferred to be ≤2.0.

The first two ratios $(B_2O_3+Al_2O_3)/SiO_2$ and $R_2O_3/SiO_2$ may determine how much of these trivalent elements could enter into $Si^{4+}$ crystal lattice sites and may produce negative charge density in the passivation structure. The latter two ratios $(B_2O_3+Al_2O_3)/ZnO$ and $R_2O_3/ZnO$ may determine how much of these trivalent elements are used in a network forming role with $Zn^{2+}$ and without contributing to negative charge density. The last two ratios can be extended with respect to ZnO, to include other larger divalent ions such as $Ba^{2+}$, $Sr^{2+}$, $Ca^{2+}$ and to some extent $Mg^{2+}$ as RO, where R stands for ($Zn^{2+}+Ba^{2+}+Sr^{2+}+Ca^{2+}+Mg^{2+}$).

All these competing requirements have been considered in developing the present passivation glass coating compositions that are lead free, cadmium free, alkali metal oxides free, colored transition metal ions free (i.e. free of metal oxides of V, Fe, Co, Ni, Cr, Cu, Mn). In many embodiments, the passivation glass coating compositions are also free of pentavalent ions, especially $Ta^{+5}$.

The present fired passivation glass layers have in one embodiment, a coefficient of thermal expansion less than $45 \times 10^{-7}$/° C. and a Tg less than 550° C. (preferably in between 400-550° C.). These bismuth passivation glass coating compositions are resistant to being excessively reduced to bismuth metal by Si, and therefore do no form an interconnected metal layer at the interface between the fired passivation glass layer and silicon. If the passivation glass coating compositions experience devitrification, then crystallizing produces low expansion crystals such as gahnite $ZnAl_2O_4$, or preferably Willemite $Zn_2SiO_4$, or Indialite $Mg_2Al_4Si_5O_{18}$, but does not produce appreciable amounts of zinc borate crystals, since such borate crystals deplete the fired passivation glass layer of $B_2O_3$, which might be needed to provide desired negative charge density. The passivation glass coating compositions do not create micro cracks at the interface between fired passivation glass layer and silicon, and are chemically resistant to acid or base washes. The passivation glass coating compositions provide good wetting and bonding to silicon or to other coatings on silicon, such as $SiO_2$ or $Al_2O_3$ or $Si_3Nx$ or $TiO_2$ and their combinations. The passivation glass coating compositions are believed to provide net negative charge density for N+/N bulk/P+ semiconductor structures that are commonly used. However, in one alternative embodiment, for P+/P bulk/N+ semiconductor structures, the passivation glass coating compositions could provide a net positive charge surface density for effective passivation in P+/P bulk/N+ structure). This can be achieved by controlling the ratios of $R_2O_3/SiO_2$ to $R_2O_3/RO$.

Unless otherwise noted, all compositional percentages disclosed herein are by mole % and are given for a composition prior to firing. Numerical ranges of oxides or other components that are bounded by zero on the lower end (for example, 0-7% by weight) are intended to provide support for the concept "up to [the upper limit]" of the component. For example, "0-7% by weight SrO" is intended to provide support for "up to 7% SrO by weight" as well as a positive recitation that SrO is present at some amount, for example at 0.01 mole % or 0.1 mole %, and in an amount that does not exceed the upper limit. An example of the latter is "comprises SrO, provided the amount does not exceed 10 mole %."

All ranges disclosed herein are to be understood to encompass the beginning and ending range values and any and all subranges therein. For example, a stated range of "7 mole % to 17 mole %" should be considered to include any and all subranges between (and inclusive of) the minimum value of 7 and the maximum value of 17. That is, all subranges are included, beginning with a minimum value of 7 or more, and ending with a maximum value of 17 or less, e.g., 7.0 to 8.7, 9.3 to 12.9, 11.7 to 17, etc.

Passivation Glass Component

In accordance with the above considerations, the passivation glass coating compositions in one preferred embodiment includes a glass component comprising before firing, 5-56 mole % $Bi_2O_3$, 15-60 mole % ZnO, 0-43 mole % or 0.1-43 mole % $B_2O_3$, 0-15 mole % or 0.1-15 mole % $Al_2O_3$, 3-53 mole % $SiO_2$, 0-15 mole % or 0.1-15 mole % $(La_2O_3+Y_2O_3+Ga_2O_3)$, 1.5-44 mole % total $R_2O_3$ (where R represents trivalent ions including $B^{3+}$, $Al^{3+}$, $In^{3+}$, $Sc^{3+}$, and lanthanide ions from $Ce^{3+}$ to $Lu^{3+}$, and excluding color producing transition metals such as $Mn^{3+}$, $Fe^{3+}$, $Cr^{3+}$, $Co^{3+}$, $V^{3+}$). In one aspect, the glass component includes 0-16 mole % or 0.1-16 mole % BaO, 0-16 mole % or 0.1-16 mole % MgO. In another aspect, the glass component includes 0-16 mole % BaO, 0-16 mole % or 0.1-16 mole % MgO, 0-16 mole % or 0.1-16 mole % (CaO+SrO), and $(B_2O_3+SiO_2)\leq 54$. In another aspect, the glass component includes 0-15 mole % or 0.1-15 mole % $La_2O_3$, and 0.2-42 mole % $(B_2O_3+Al_2O_3)$.

In another more preferred embodiment, the glass component includes 5-18 mole % $Bi_2O_3$, 21-45 mole % ZnO, 1.5-23 mole % $B_2O_3$, 0.1-12 mole % $Al_2O_3$, 25-48 mole % $SiO_2$, 0-10 mole % or 0.1-10 mole % $La_2O_3$, and 1.5-36 mole % total $R_2O_3$ (where R represents trivalent ions including $B^{3+}$, $Al^{3+}$, $Y^{3+}$, $Ga^{3+}$, $In^{3+}$, $Sc^{3+}$, and lanthanide ions from $Ce^{3+}$ to $Lu^{3+}$, and excluding color producing transition metals such as $Mn^{3+}$, $Fe^{3+}$, $Cr^{3+}$, $Co^{3+}$, $V^{3+}$). In one aspect, the glass component includes 0-6 mole % or 0.1-6 mole % BaO, and 0-12 mole % or 0.1-12 mole % MgO.

In another most preferred embodiment, the glass component includes 5-15 mole % $Bi_2O_3$, 25-43 mole % ZnO, less than 10 mole % or 0.1-10 mole % $B_2O_3$, 5-12 mole % $Al_2O_3$, 30-48 mole % $SiO_2$, 0-10 mole % or 0.1-10 mole % $La_2O_3$, and 1.5-36 mole % total $R_2O_3$ (where R represents trivalent ions, including $B^{3+}$, $Al^{3+}$, $Y^{3+}$, $Ga^{3+}$, $In^{3+}$, $Sc^{3+}$, and lanthanide ions from $Ce^{3+}$ to $Lu^{3+}$, and excluding color producing transition metals such as $Mn^{3+}$, $Fe^{3+}$, $Cr^{3+}$, $Co^{3+}$, $V^{3+}$). In one aspect, the glass component includes less than 5 mole % or 0.1-5 mole % $B_2O_3$. In another aspect, the glass component includes 0.1-2 mole % BaO, and 5-12 mole % MgO. In still another aspect, $(B_2O_3+SiO_2)\leq 54$ mole %.

In one preferred embodiment, the glass component has the following ranges of molar ratios of oxides: $(B_2O_3+Al_2O_3)/SiO_2=0.1$ to 9.0; $(B_2O_3+Al_2O_3)/ZnO\leq 5.0$; $R_2O_3/SiO_2=0.1-15$. In one aspect, the molar ratio of $(B_2O_3+Al_2O_3)/ZnO$ is less than or equal to 3.0.

In another most preferred embodiment, the glass component has the following ranges of molar ratios of oxides: $(B_2O_3+Al_2O_3)/SiO_2=0.1$ to 1.2; $(B_2O_3+Al_2O_3)/ZnO\leq 2.0$; $R_2O_3/SiO_2=0.1-2.0$.

In another embodiment $R_2O_3/ZnO=0.2-10$. In yet another embodiment $R_2O_3/ZnO=0.2-5.0$.

In another embodiment $R_2O_3/R_0=0.2-10$, where $RO=(ZnO+MgO+CaO+SrO+BaO)$. In yet another embodiment $R_2O_3/R_0=0.2-5.0$.

In one embodiment, upon firing of the passivation glass coating composition to form a fired passivation glass layer, the noted molar ratios of trivalent oxides with respect to $SiO_2$ and/or ZnO increase as a result of firing.

In one embodiment, the glass component includes a mixture of one or more (e.g. at least two) separate glasses that can be in the form of glass frit or powder. The first glass is rich in $B_2O_3$, such as ≥10 mole %, preferably 10-42 mole %, more preferably 10 to 25 mole %, most preferably 10-15 mole % and thereby allowing the passivation glass coating composition to soften and flow at an initial lower temperature and providing good wetting of silicon and promoting excellent bonding. The second glass includes little or no $B_2O_3$, such as <9 mole %, preferably <5 mole %, more preferably <3 mole %, and most preferably 0 mole %, and includes instead other oxides of $R_2O_3$, such as $Al_2O_3$ or $La_2O_3$. The second glass softens/flows at a higher temperature, and reacts with the first glass to completely change the characteristic of both glasses resulting in: little to no continuous bismuth particles at the interface between the silicon and fired passivation glass layer; an absence of zinc borate crystals, which if formed could undesirably deplete the residual glass of negative surface charge density generating 3+ ions such as $B^{3+}$; and may lead to the precipitation of $Zn_2SiO_4$ crystals at a later stage, which helps to concentrate beneficial trivalent ions from the glasses into the residual glass, which makes up the bulk of the fired passivation glass layer after crystallization has occurred in the passivation glass layer. In other words, the first glass provides an initial wetting and bonding to silicon at a relatively low temperature, and the second glass reacts with the first glass at a relatively higher temperature and prevent excessive dissolution of silicon from the substrate by the first glass, thereby preventing undue degradation of a portion of the PN junction, which could reduce the PN junction voltage. If desired, the second glass can be formulated to experience beneficial crystallization of non-zinc-borate crystals. In one aspect, seed crystals of gahnite $ZnAl_2O_4$, Willemite $Zn_2SiO_4$, or Indialite $Mg_2Al_4Si_5O_{18}$, for example, are included in the glass component to induce the formation of crystals upon firing of the passivation glass coating composition. Crystalline seed materials useful herein include zinc silicates, zinc titanates, silicon zirconates, aluminum silicates, calcium silicates, and combinations thereof. The crystalline materials may include, without limitation, $Zn_2SiO_4$, $Zn_2Ti_3O_8$, $ZnTiO_3$, and $Al_2SiO_5$.

In another embodiment, neither of the first or second glasses significantly crystallize on their own, but on reaction with each other, can crystallize beneficial crystals, such as $Zn_2SiO_4$.

In yet another embodiment, neither of the first or second glasses crystallize on their own, but on reaction with the substrate silicon, can crystallize beneficial crystals, such as $Zn_2SiO_4$ at the interface.

In one embodiment, the glass component further includes 0-10 mole %, 0-8 mole %, 0-5 mole %, or 0.1-5 mole % of $TiO_2$, $ZrO_2$, $GeO_2$, $CeO_2$, or combinations thereof.

As discussed, the glass component can include glass in the form of glass frit or glass powder. In several embodiments, the glass frit particles have a D50 average particle size of about 0.4 to 40 microns, from about 0.5 to 20 microns or from about 0.6 to 10 microns, for example about 10-15 microns, 5-10 microns, or 0.4-3 microns, most preferably 3-12 microns. In certain embodiments, glass frit powders with different particle size ranges can be mixed, such as mixing D50 of 0.4 to 3 micron range powder with D50 of 3-12 micron range powder, in order to get optimum packing of glass frit powders to avoid excessive bubble formation to increase the passivation quality.

The passivation glass coating composition, the glass component, or the individual glass frits, has a glass transition temperature (Tg) of greater than 350° C., preferably greater than 400° C., and less than 550° C. or less than 500° C. in order to keep the firing temperatures at about 600-950° C. The softening point of the passivation glass coating composition, the glass component, or of the individual glass frits, is less than or equal to 950° C., or less than or equal to 850° C., preferably less than 750° C., more preferably less than 650° C., and most preferably less than 600° C. The coefficient of thermal expansion of the fired passivation glass layer is less than $60 \times 10^{-7}/°$ C., preferably less than $45 \times 10^{-7}/°$ C., most preferably less than $40 \times 10^{-7}/°$ C.

In one embodiment the surfaces of the glass frit or powder can be modified by different coatings, preferably organic coatings, to change the surface characteristics, for example to provide easy dispersion of the glass frit powders in slurries, to reduce bubbles in the fired passivation glass layer, or to make the powder applicable by different spray processes such as electrostatic spraying. The passivation glass coating composition, the glass component, or individual glass frits, can be subject to various treatments, such as silane treatments for example, in order to allow for electrostatic spraying of the passivation glass coating composition, or to modify other properties of the glass frits. Alternatively the glass powders can be coated with dispersing additives to disperse the powders without hard packing in solvents, such as water or ethylene glycol.

Inorganic Fillers

The passivation glass coating composition or glass component may comprise one or more inorganic fillers to adjust properties such as thermal expansion coefficients. These can be materials such as zircon, willemite, cordierite, fused silica, negative thermal expansion materials based on stuffed beta-quartz solid solutions such as beta eucryptite ($Li_2Al_2Si_2O_8$), tialite ($Al_2TiO_5$), and $ZrW_2O_8$-family of NTE materials such as $ZrW_2O_8$, zeolites, zeolite-like materials, NZP type materials such as $NaZr_2P_3O_{12}$, ultra-low thermal expansion ceramics such as $MZr_4P_6O_{24}$ (MZP) type materials, where M stands for Mg, Ca, Sr, Ba, or their mixtures. Multiple fillers can be added, either as a mix or as pre-reacted components in different particle size ranges. These can be added at up to 40 weight %, and the sizes can range D50 of 0.4 to 30 microns, 1-3 microns, 3-8 microns, 8-12 microns, 10-20 microns or 15-25 microns.

Devices and Methods

The passivation glass coating compositions of the present subject matter are applied to the periphery of semiconductor devices such as having a p-type semiconductor, an n-type semiconductor, with a p-n junction between them. The passivation glass coating compositions upon firing, produce a fired passivation glass layer that reduces the amount of reverse leakage current escaping from the semiconductor device. The fired passivation glass layers can be applied in one or more layers, each of which can be tailored to have a specific coefficient of thermal expansion (CTE) so the layer in contact with the silicon has a CTE more closely matched to the silicon substrate, or have a specific surface charge density to modulate the level of passivation as desired.

The passivation glass component can be combined with a vehicle comprising an organic or inorganic liquid (e.g. a solvent or a coating/treatment for the powder) to form a passivation glass coating composition in the form of a functionalized powder, a paste, a tape, or a slurry, for example, and be applied by any known method, including by spin coating, doctor blading, screen printing, electrophoretic deposition, electrostatic spraying, wet spraying, dip coating, digital printing, pad printing, flow coating, roll coating, and the like. The vehicle can include water, solvent, or a combination thereof, for example. The solvent can comprise organic or inorganic solvents, and polar or non-polar solvents including alcohols, glycols, ethers, alkanes, or the like. In one embodiment, the passivation glass coating composition includes diethylene glycol. The vehicle can also include a binder dissolved or dispersed in the water and/or solvent. The binder can include any saccharides and their derivatives, proteins such as gelatin, natural or synthetic polymers, or a combination thereof.

After application to the semiconductor, the passivation glass coating composition is then fired to form a fired passivation glass layer on the semiconductor. The semiconductor can include silicon-based semiconductors including thyristors, rectifiers, diodes, and the like. Devices based on other semiconductors such as III-V semiconductors (for example GaAs), IV semiconductors (such as SiC), III-V semiconductors (such as GaN, GaP), II-VI semiconductors (Such as CdS) and the like. Among these, semiconductors for higher temperature applications, such as SiC and those for LED applications such as GaN, GaP and SiC, are of particular importance. Because of the inventive passivation glass coating compositions, the semiconductor device having the fired passivation glass layer can have upper level limits on operating temperatures of greater than 150° C., greater than 200° C., or greater than 250-300° C. In one embodiment, the upper level limit on operating temperature of the device is from 150-350° C. The passivation glass coating composition can be applied and fired directly on the semiconductor, or can be applied to other coatings on silicon, such as coatings of $SiO_2$, $TiO_2$, $Si_3N_4$, $Al_2O_3$, or the like, that have been first formed to the semiconductor. The fired passivation glass layer thus formed by the inventive passivation glass coating composition, is compatible with metal leads typically present on semiconductor devices, such as those including metals of Mo, W, Cu, Ni, Ag, Al, and Au.

Other Additives

The passivation glass coating composition can include optional additives for adjusting certain properties of the coating composition or of the final fired passivation glass layer. The additives are not particularly limited by the present subject matter, and can include any additive as desired for a particular application. Additives to be included in the coating composition may vary depending on the desired application method, the desired characteristics of the coating composition or fired passivation glass layer, and the like.

Suitable additives can include for example, a thixotrope, an additional solvent(s) that is the same or different from those described herein, a coloring agent, binders, a lubricant, a dispersant, a leveling agent, an antistatic agent, an antioxidant, and fillers such as cordierite or other expansion modifiers, as desired for a particular application. The additives can be included up to about 20 wt % or more of the coating composition.

EXAMPLES

In order to further assess the various aspects and benefits of the present subject matter, a series of investigations were undertaken to evaluate the passivation glass coating compositions and fired passivation glass layers formed therefrom. All the examples exclude zinc-borate crystals.

Several example passivation glass coating compositions were prepared and fired to produce a fired passivation glass layer. Table 1 shows the mole % percentage of oxides for each glass component included in the passivation glass coating compositions.

Many of these passivation glass coating compositions upon firing produce willemite ($Zn_2SiO_4$), which are beneficial in terms of low coefficients of thermal expansion to match up with silicon. Some result in crystalized gahnite ($ZnAl_2O_4$), which although good for lower thermal expansion, may not be desired because $R^{3+}$ ions are including in the crystal structure instead of in the fired passivation glass layer where they would contribute to negative surface charge density.

Although glass components in Table 1 are suitable for higher firing temperature applications because of higher Tg, the produced fired passivation glass layers have coefficients of thermal expansion in the 45-65×10$^{-7}$/° C. range, rather than less than 45×10$^{-7}$/° C. as desired to match with silicon.

Several additional example passivation glass coating compositions were prepared and fired to produce fired passivation glass layers. Table 2 shows the mole % percentage of oxides for each glass component in the passivation glass coating compositions. Also various ratios of trivalent ions to $SiO_2$ and trivalent ions to ZnO in the glass component are shown.

TABLE 2

|  | Glass Component (mole %) | | |
| --- | --- | --- | --- |
|  | 7 | 8 | 9 |
| Oxide | | | |
| Bi2O3 | 5 | 8 | 8 |
| ZnO | 21 | 26 | 29 |
| R2O3 | 31 | 23 | 18 |
| SiO2 | 31 | 36 | 40 |
| RO | 11 | 8 | 5 |
| Total | 100 | 100 | 100 |
| Oxide Ratios | | | |
| B2O3/SiO2 | 0.68 | 0.39 | 0.26 |
| Al2O3/SiO2 | 0.33 | 0.23 | 0.18 |
| (B2O3 + Al2O3)/SiO2 | 1.01 | 0.62 | 0.44 |
| (Bi2O3 + R2O3)/SiO2 | 1.20 | 0.83 | 0.66 |

TABLE 1

|  | Glass Component (mole %) | | | | | |
| --- | --- | --- | --- | --- | --- | --- |
|  | 1 | 2 | 3 | 4 | 5 | 6 |
| Oxide | | | | | | |
| Bi2O3 | 10 to 15 | 11 | 11 | 11 | 11 | 11 |
| ZnO | 40 to 45 | 35 | 43 | 43 | 43 | 39 |
| R2O3 | 40 to 44 | 7 | 2 | 7 | 7 | 10 |
| SiO2 | 3 to 5 | 47 | 45 | 40 | 40 | 40 |
| Total | 100 | 100 | 100 | 100 | 100 | 100 |
| Oxide Ratios | | | | | | |
| B2O3/SiO2 | 8.77 | 0.03 | 0.03 | 0.04 | 0.04 | 0 |
| Al2O3/SiO2 | 0 | 0.11 | 0 | 0.13 | 0 | 0.25 |
| (B2O3 + Al2O3)/SiO2 | 8.77 | 0.14 | 0.03 | 0.16 | 0.04 | 0.25 |
| (Bi2O3 + R2O3)/SiO2 | 11.13 | 0.37 | 0.28 | 0.44 | 0.44 | 0.53 |
| B2O3/ZnO | 0.97 | 0.04 | 0.04 | 0.04 | 0.04 | 0 |
| (B2O3 + Al2O3)/ZnO | 0.97 | 0.19 | 0.04 | 0.15 | 0.04 | 0.26 |
| (Bi2O3 + R2O3)/ZnO | 1.24 | 0.50 | 0.30 | 0.41 | 0.41 | 0.54 |
| Fired Passivation Glass Layer | | | | | | |
| Tg (° C.) | 480 | 540 | 538 | 553 | 540 | 557 |
| CTE (×10$^{-7}$/° C.) | 63.5 | 53.1 | 47.6 | 61.5 | 65.4 | 65.2 |
| Density (g/cm$^3$) | 4.85 | 4.68 | 5.01 | 4.89 | 5.19 | 4.75 |

TABLE 2-continued

| | Glass Component (mole %) | | |
|---|---|---|---|
| | 7 | 8 | 9 |
| B2O3/ZnO | 0.97 | 0.54 | 0.36 |
| (B2O3 + Al2O3)/ZnO | 1.45 | 0.86 | 0.61 |
| (Bi2O3 + R2O3)/ZnO | 1.71 | 1.15 | 0.91 |
| Fired Passivation Glass Layer | | | |
| Tg, (° C.) | 474 | 457 | 476 |
| CTE (×10$^{-7}$/° C.) | 36.4 | 39.9 | 34.7 |
| Density (g/cm$^3$) | 3.73 | 4.06 | 4.25 |

The glass components of Table 2 produce fired passivation glass layers that have the desired Tg and expansion ranges suitable for use as fired passivation glass layers. The glass components of Table 2 are either a single glass, or mixtures of two different glasses (i.e. glass frits) and fillers. In mixtures of two different glasses, the first glass frit is rich in $B_2O_3$, such as about 42 mole %, and thereby allows the coating composition to soften and flow at an initial lower temperature to provide good wetting and bonding with silicon; and the second glass frit includes little or no $B_2O_3$, and includes instead other oxides of $R_2O_3$, such as $Al_2O_3$ or $La_2O_3$. The second glass frit thereby melts at a higher temperature, and reacts with the first glass frit to completely change the characteristics of both glass frits resulting in: little to no continuous bismuth particles at the interface between the silicon and fired passivation glass layer; an absence of zinc-borate crystals; and may include precipitation of $Zn_2SiO_4$ crystals at a later stage.

The glass coating compositions including the glass components of Table 2, were fired along with typical glass coating compositions including conventional lead passivation glasses, which are shown below in Table 3 as Examples 10 and 11. Table 3 shows mole % percentage of oxides for each glass component in the passivation glass coating compositions, and also various ratios of trivalent ions to $SiO_2$ and trivalent ions to ZnO in the glass component are shown.

TABLE 3

| | Glass Component (mole %) | | | | | |
|---|---|---|---|---|---|---|
| | Lead | | Lead free | | | |
| | 10 | 11 | 2 | 7 | 8 | 9 |
| Oxide | | | | | | |
| PbO | 16 | 19 | — | — | — | — |
| Bi2O3 | — | — | 11 | 5 | 8 | 8 |
| ZnO | — | — | 35 | 21 | 26 | 29 |
| R2O3 | 15 | 19 | 7 | 31 | 23 | 18 |
| SiO2 | 64 | 62 | 47 | 31 | 36 | 40 |
| RO | 5 | — | — | 11 | 8 | 5 |
| Total | 100 | 100 | 100 | 100 | 100 | 100 |
| Oxide Ratios | | | | | | |
| B2O3/SiO2 | 0.15 | 0.14 | 0.03 | 0.68 | 0.39 | 0.26 |
| Al2O3/SiO2 | 0.09 | 0.16 | 0.11 | 0.33 | 0.23 | 0.18 |
| (B2O3 + Al2O3)/SiO2 | 0.24 | 0.30 | 0.14 | 1.01 | 0.62 | 0.44 |
| (Bi2O3 + R2O3)/SiO2 | — | — | 0.37 | 1.20 | 0.83 | 0.66 |
| B2O3/PbO | 0.62 | 0.46 | — | — | — | — |
| (B2O3 + Al2O3)/PbO | 0.99 | 0.98 | — | — | — | — |
| B2O3/ZnO | 0.62 | 0.46 | 0.04 | 0.97 | 0.54 | 0.36 |
| (B2O3 + Al2O3)/ZnO | 0.99 | 0.98 | 0.19 | 1.45 | 0.86 | 0.61 |
| (Bi2O3 + R2O3)/ZnO | — | — | 0.50 | 1.71 | 1.15 | 0.91 |
| Fired Passivation Glass Layer | | | | | | |
| Tg, (° C.) | 499 | 536 | 540 | 474 | 457 | 476 |
| CTE (×10$^{-7}$/° C.) | 38.5 | 45 | 53.1 | 36.4 | 39.9 | 34.7 |
| Density (g/cm$^3$) | 3.36 | 3.54 | 4.68 | 3.73 | 4.06 | 4.25 |

From Table 3 it can be seen that properties of Tg and CTE for the inventive fired passivation glass layers (Examples 2, 7, 8, 9) are as good as, and even better than, conventional lead based fired passivation glass layers (Examples 10, 11).

The exemplary lead free glass components and the conventional lead glass components listed in Table 3, were formed into passivation glass coating composition slurries by dispersing appropriate amounts of these glass components in diethylene glycol solution in percentages as shown in Table 4.

TABLE 4

| | Passivation Glass Coating Composition (wt %) | | | | | |
|---|---|---|---|---|---|---|
| | Lead | | Lead-free | | | |
| Glass Component Used | 10 | 11 | 2 | 7 | 8 | 9 |
| Glass Component | 64 | 66 | 69 | 67 | 69 | 70 |
| Diethylene Glycol | 36 | 35 | 31 | 33 | 31 | 30 |
| Dispersant | — | — | — | — | 0.5 | 0.5 |
| Total | 100 | 100 | 100 | 100 | 100 | 100 |
| Slurry Viscosity (poise) | 12.46 | 6.02 | about 6.0 | 5.98 | 1.95 | 2.25 |

As shown in Table 4, these passivation glass coating compositions had viscosity of 2 to 13 poise, which are suitable for spin coating. In accordance with the present subject matter, the passivation glass coating compositions can further include a dispersant to keep the glass component from agglomerating and settling.

These passivation glass coating compositions were spin coated on silicon wafers, dried and then fired in typical passivation glass layer firing profiles, with peak firing temperatures of 710° C. (10 minutes) and 815° C. (10 minutes). The fired passivation glass layer/silicon interfaces were studied by SEM/EDAX for interaction, appearance, crystals and defects.

Figure 2:
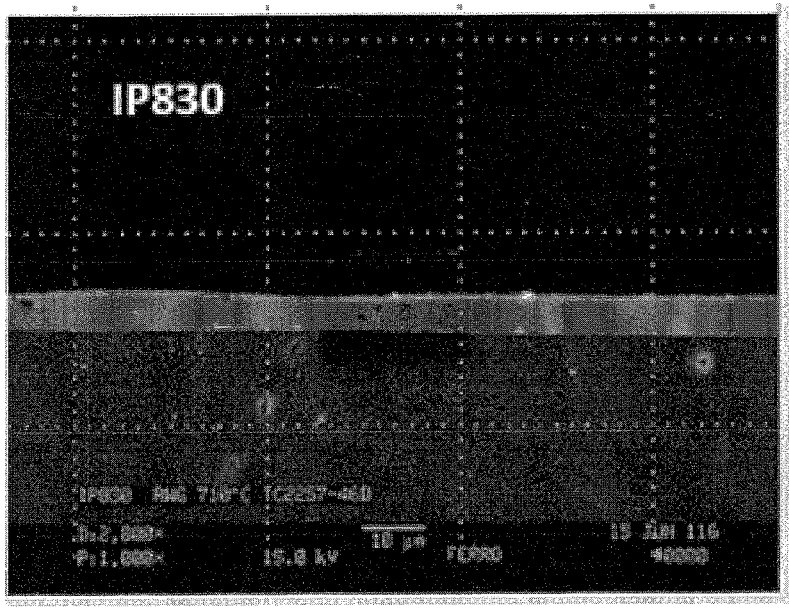
FIG. 2 is an SEM picture in cross-section of another prior art lead passivation glass layer that has been fired on a silicon wafer at 710° C.
Figure 3:
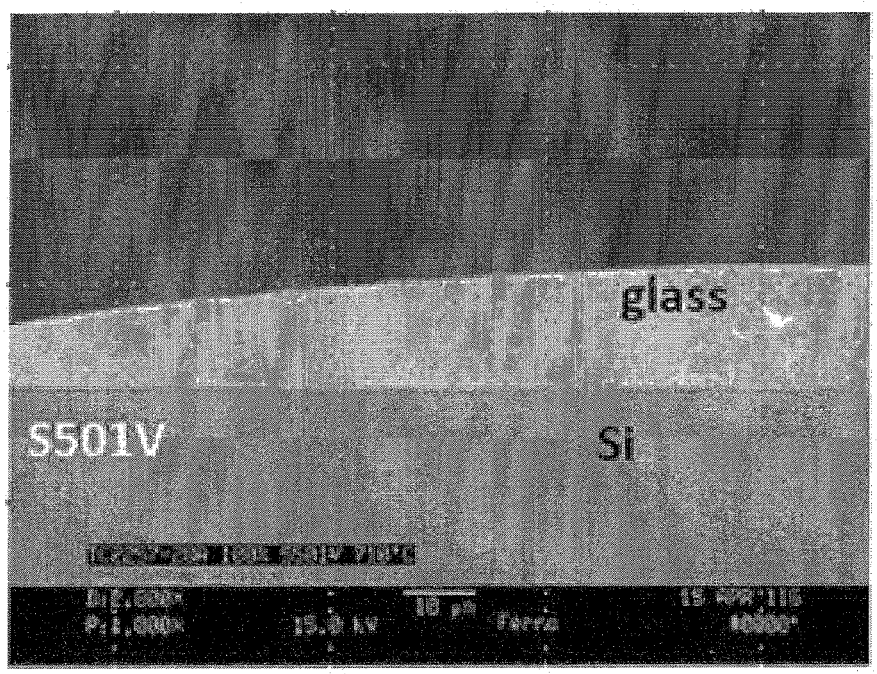
FIG. 3 is an SEM picture in cross-section of a lead-free passivation glass layer that has been fired on a silicon wafer at 710° C. in accordance with the present subject matter.
Figure 4:
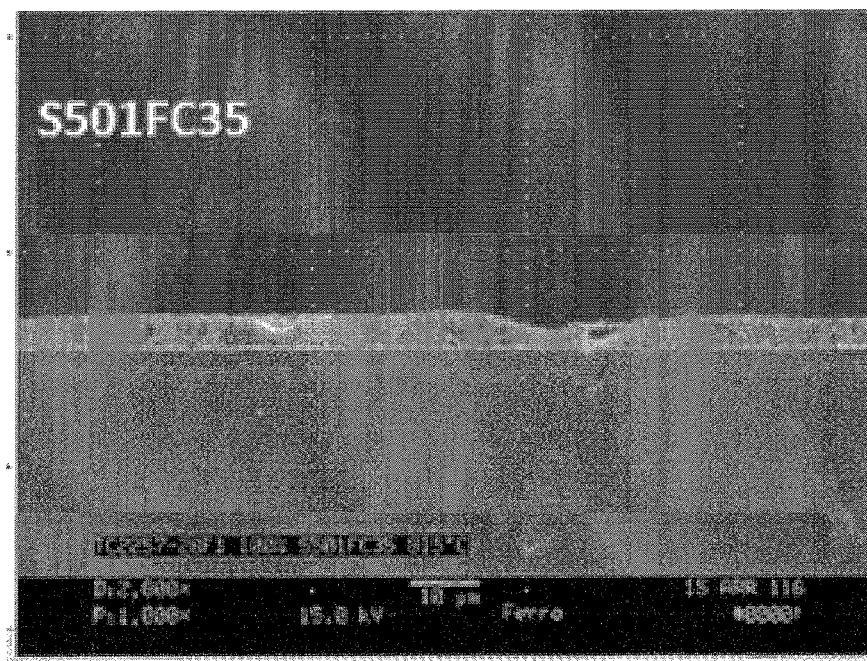
FIG. 4 is an SEM picture in cross-section of another lead-free passivation glass layer that has been fired on a silicon wafer at 710° C. in accordance with the present subject matter.
Figure 5:
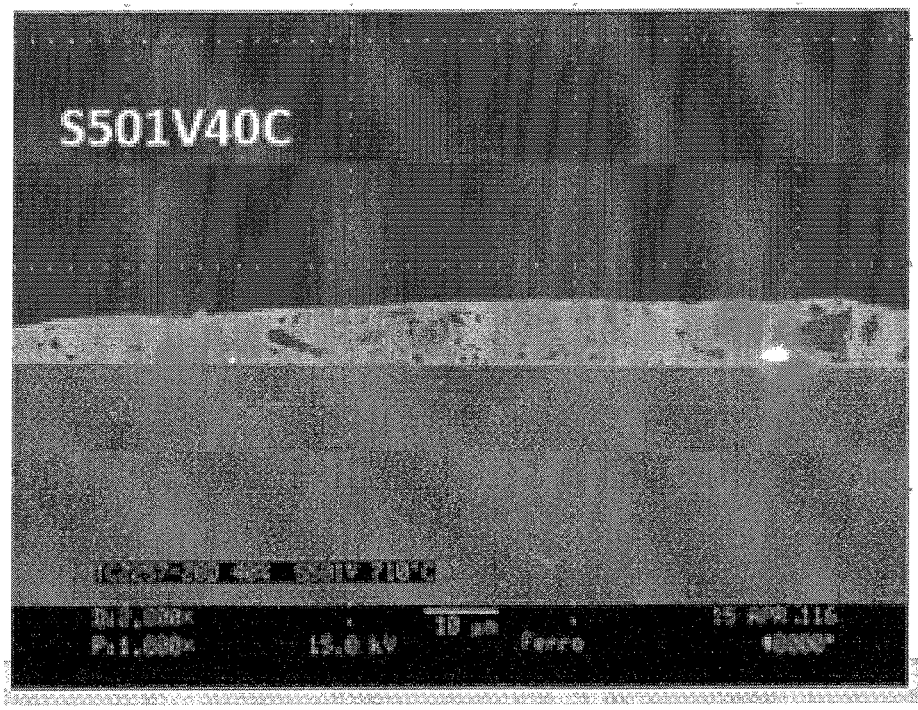
FIG. 5 is an SEM picture in cross-section of another lead-free passivation glass layer that has been fired on a silicon wafer at 710° C. in accordance with the present subject matter.
Figure 6:
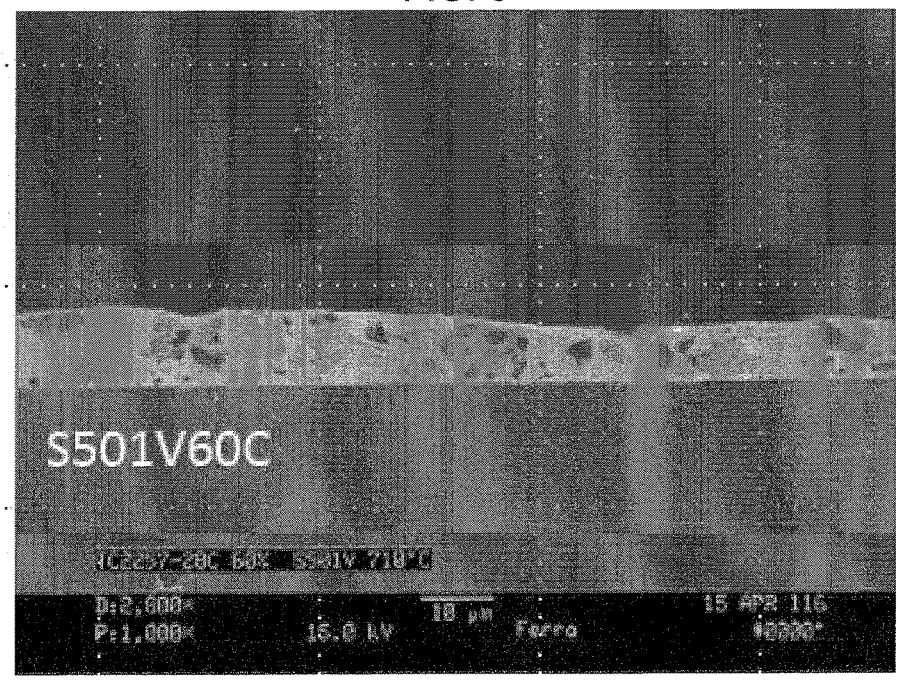
FIG. 6 is an SEM picture in cross-section of another lead-free passivation glass layer that has been fired on a silicon wafer at 710° C. in accordance with the present subject matter.

The results of these SEM/EDAX analyses are shown in cross section in FIGS. 1-6 for the examples from Table 4, which were fired at the 710° C. heating profile on silicon wafers. FIG. 1 shows a fired passivation glass layer formed from the lead glass component 10, FIG. 2 shows a fired passivation glass layer formed from the lead glass component 11, FIG. 3 shows a fired passivation glass layer formed from the exemplary lead free glass component 2, FIG. 4 shows a fired passivation glass layer formed from the exemplary lead free glass component 7, FIG. 5 shows a fired passivation glass layer formed from the exemplary lead free glass component 8, and FIG. 6 shows a fired passivation glass layer formed from the exemplary lead free glass component 9.

Figure 7:
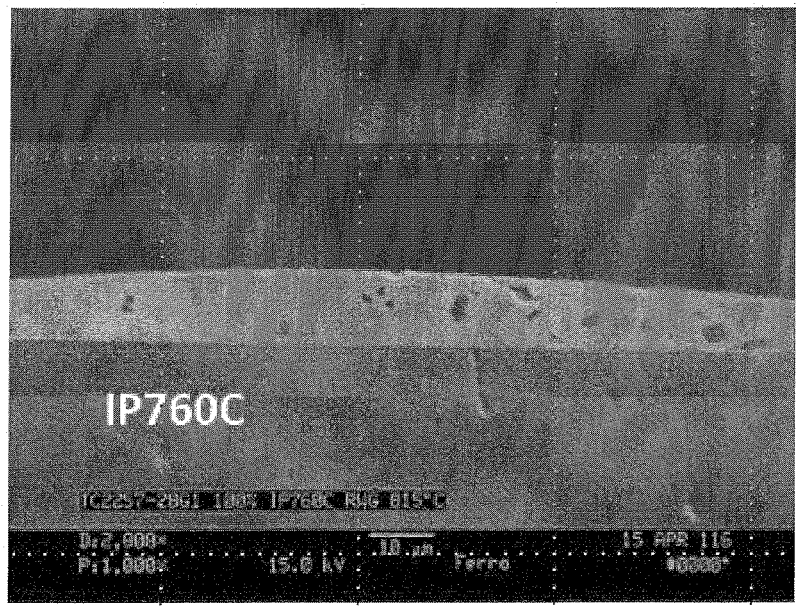
FIG. 7 is an SEM picture in cross-section of a prior art lead passivation glass layer that has been fired on a silicon wafer at 815° C.
Figure 8:
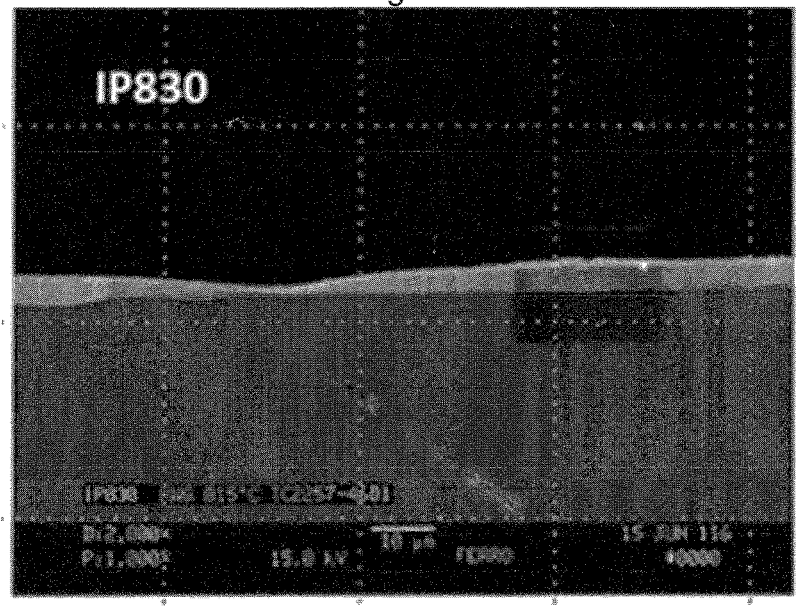
FIG. 8 is an SEM picture in cross-section of another prior art lead passivation glass layer that has been fired on a silicon wafer at 815° C.
Figure 9:
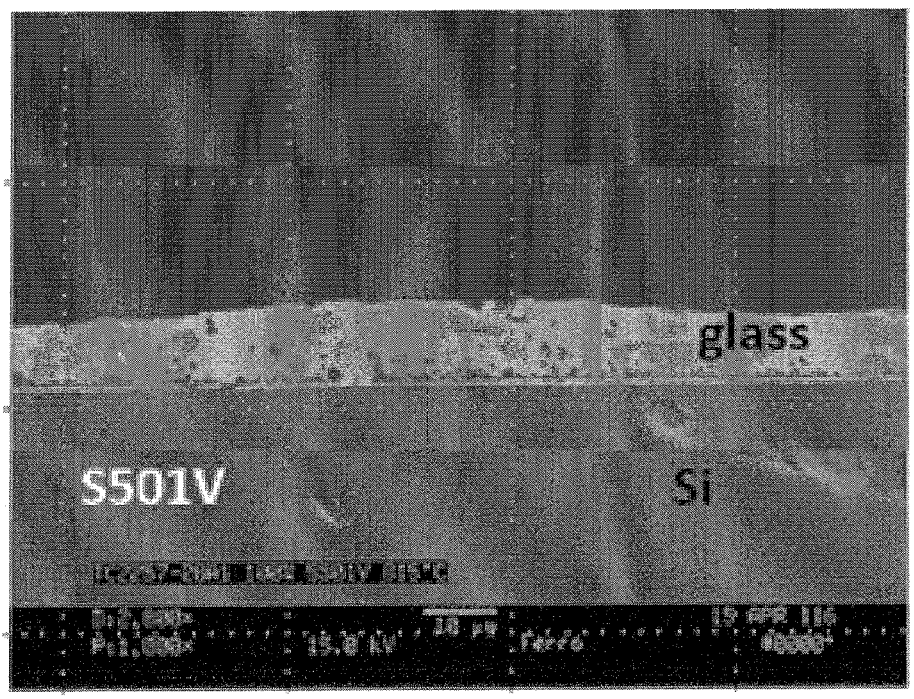
FIG. 9 is an SEM picture in cross-section of a lead-free passivation glass layer that has been fired on a silicon wafer at 815° C. in accordance with the present subject matter.
Figure 10:
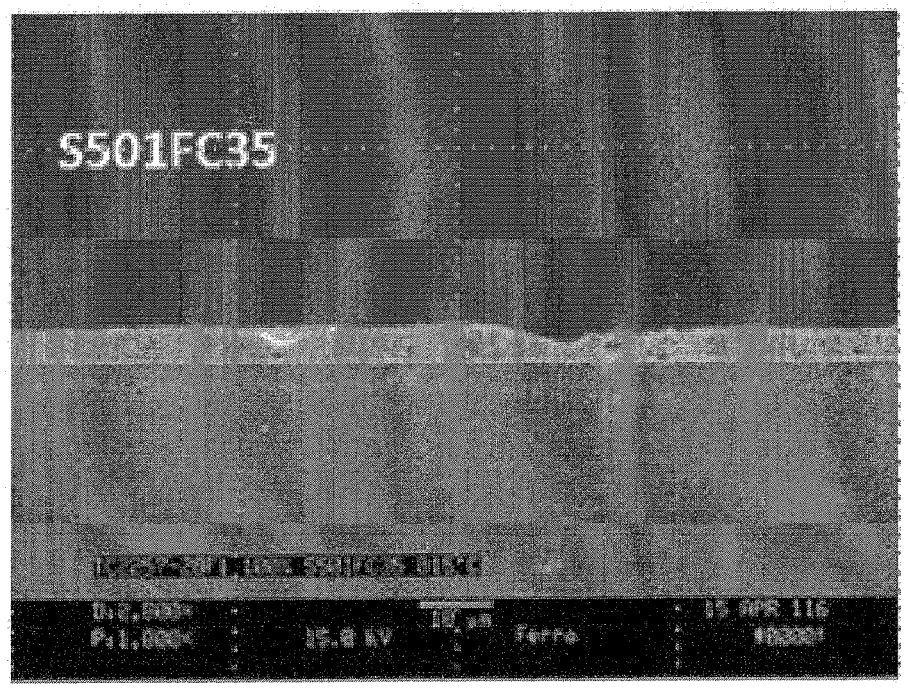
FIG. 10 is an SEM picture in cross-section of another lead-free passivation glass layer that has been fired on a silicon wafer at 815° C. in accordance with the present subject matter.
Figure 11:
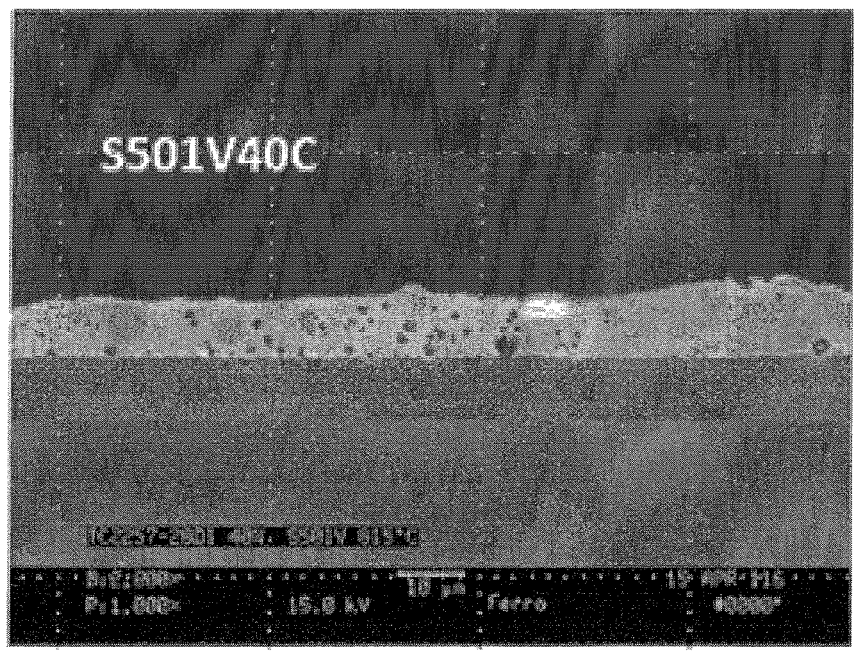
FIG. 11 is an SEM picture in cross-section of another lead-free passivation glass layer that has been fired on a silicon wafer at 815° C. in accordance with the present subject matter.
Figure 12:
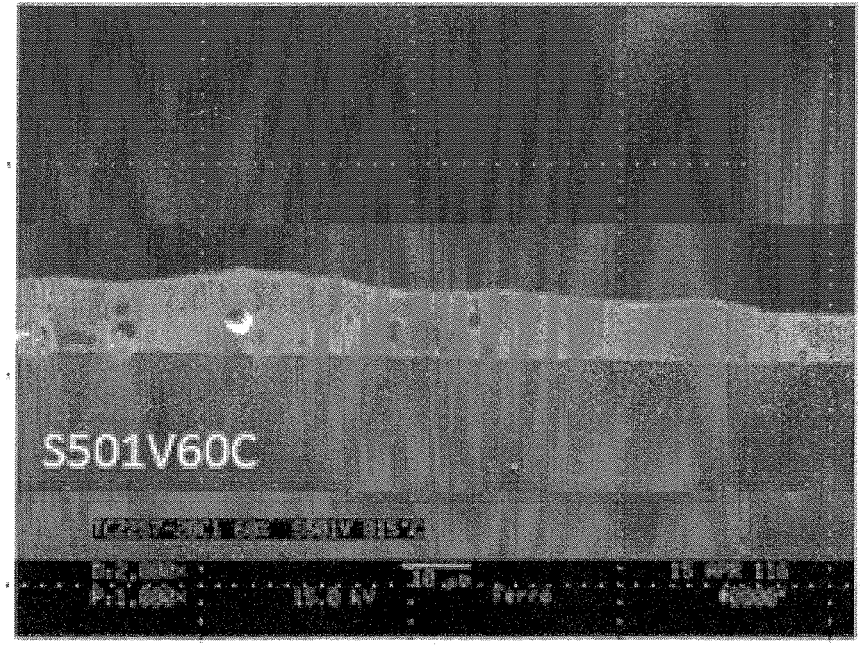
FIG. 12 is an SEM picture in cross-section of another lead-free passivation glass layer that has been fired on a silicon wafer at 815° C. in accordance with the present subject matter.

FIGS. 7-12 show results of SEM/EDAX analyses in cross section for the examples from Table 4, which were fired at the 815° C. heating profile on silicon wafers. FIG. 7 shows a fired passivation glass layer formed from the lead glass component 10, FIG. 8 shows a fired passivation glass layer formed from the lead glass component 11, FIG. 9 shows a fired passivation glass layer formed from the exemplary lead free glass component 2, FIG. 10 shows a fired passivation glass layer formed from the exemplary lead free glass component 7, FIG. 11 shows a fired passivation glass layer formed from the exemplary lead free glass component 8, and FIG. 12 shows a fired passivation glass layer formed from the exemplary lead free glass component 9.

From these figures, it can be seen that the fired passivation glass layers formed from the exemplary lead free glass components of this invention exhibit no cracking or significant voiding in the fired passivation glass layer, and have good reactivity with silicon. Some isolated metal precipitates and other reaction products are produced depending on the formulation of the glass component and coating composition. The occurrence of metal precipitates decreases, and crystallization increases, going from glass component 7 to 8 to 9 to 2. EDAX and subsequent X-Ray Diffraction (XRD) (FIGS. 13-14) shows crystallization of some beneficial $Zn_2SiO_4$ occurring.

Figure 13:
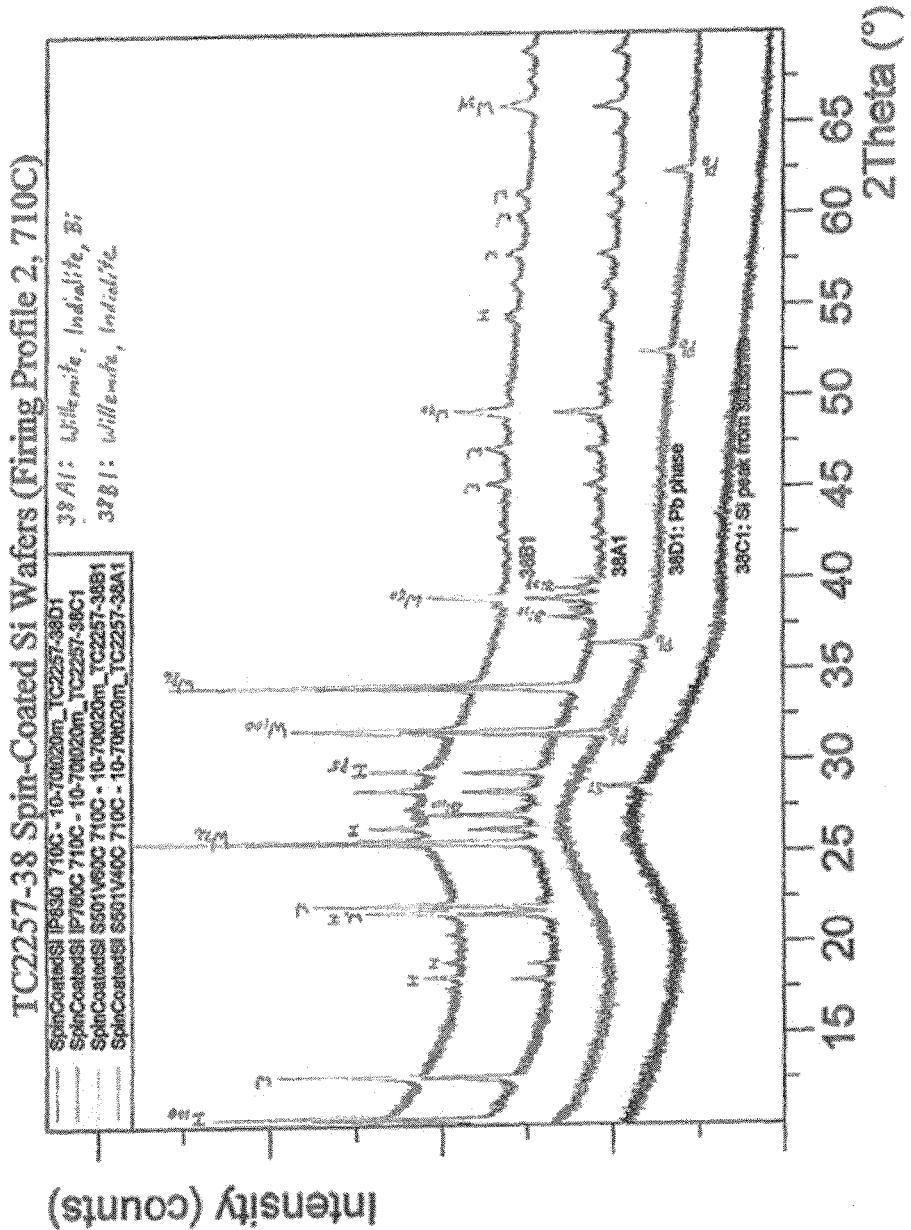
FIG. 13 is a graph showing XRD data of two prior art fired lead passivation glass layers and two fired lead-free passivation glass layers in accordance with the present subject matter, all of which were fired at 710° C.
Figure 14:
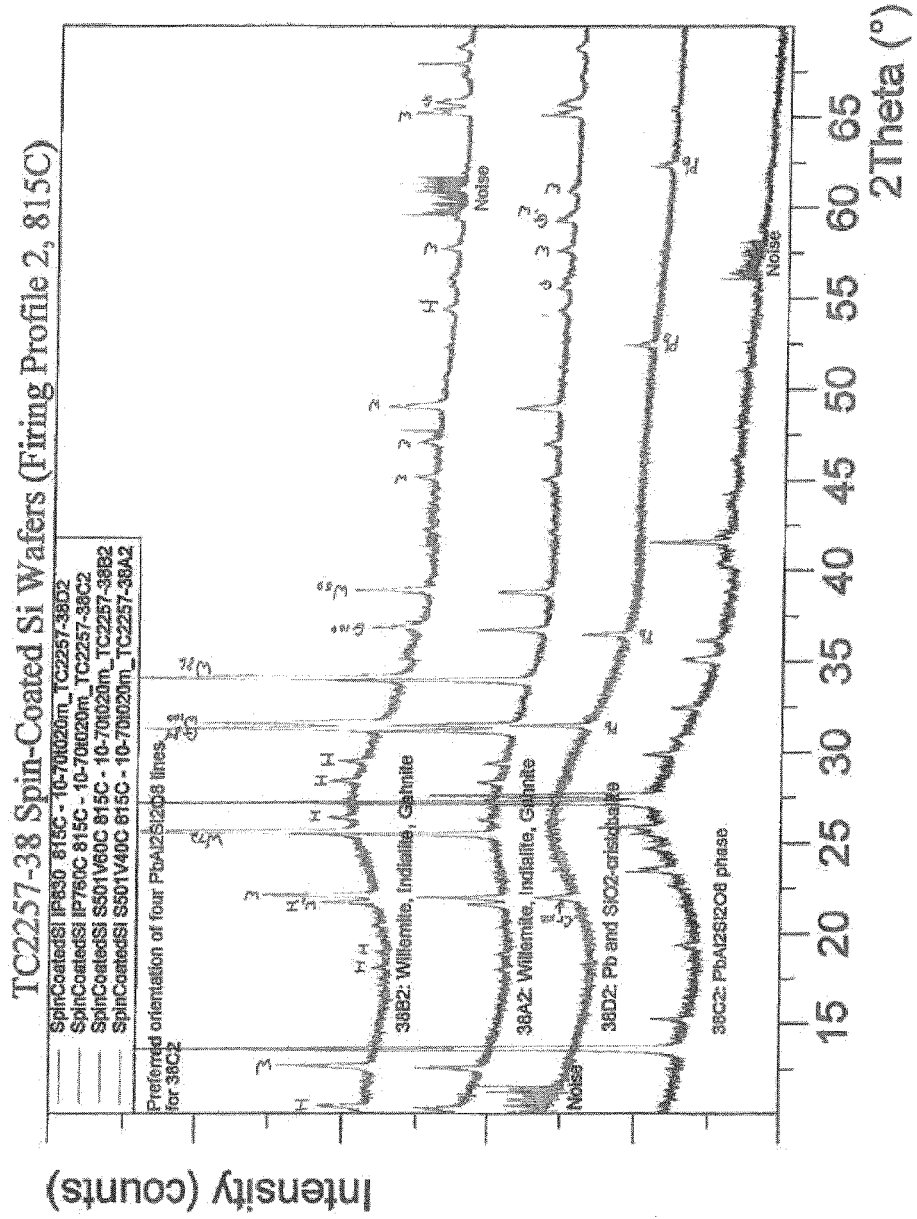
FIG. 14 is a graph showing XRD data of two prior art fired lead passivation glass layers and two fired lead-free passivation glass layers in accordance with the present subject matter, all of which were fired at 815° C.

FIG. 13 shows results of XRD analyses for the examples from Table 4 fired at the 710° C. heating profile on silicon wafers. FIG. 14 shows results of XRD analyses for the examples from Table 4 fired at the 815° C. heating profile on silicon wafers.

Many other benefits will no doubt become apparent from future application and development of this technology.

All patents, applications, standards, and articles noted herein are hereby incorporated by reference in their entirety.

The present subject matter includes all operable combinations of features and aspects described herein. Thus, for example if one feature is described in association with an embodiment and another feature is described in association with another embodiment, it will be understood that the present subject matter includes embodiments having a combination of these features.

As described hereinabove, the present subject matter solves many problems associated with previous strategies, systems and/or devices. However, it will be appreciated that various changes in the details, materials and arrangements of components, which have been herein described and illustrated in order to explain the nature of the present subject matter, may be made by those skilled in the art without departing from the principle and scopes of the claimed subject matter, as expressed in the appended claims.

What is claimed is:

1. A semiconductor device including a semiconductor including a p-n junction, and a passivation glass layer fired on the semiconductor and covering a periphery of the p-n junction, wherein prior to firing, the passivation glass layer includes a glass component comprising:
   5-56 mole % $Bi_2O_3$,
   15-60 mole % ZnO,
   0.1-43 mole % $B_2O_3$,
   0.1-15 mole % $Al_2O_3$,
   4-53 mole % $SiO_2$, and
   1.5-43 mole % total $R_2O_3$, wherein R represents trivalent ions selected from the group consisting of $B^{3+}$, $Al^{3+}$, $La^{3+}$, $Y^{3+}$, $Ga^{3+}$, $In^{3+}$, $Sc^{3+}$, and lanthanide ions from $Ce^{3+}$ to $Lu^{3+}$, and excluding color producing transition metal ions of $Mn^{3+}$, $Fe^{3+}$, $Cr^{3+}$, $V^{3+}$, $Co^{3+}$.

2. The semiconductor device according to claim 1, wherein the glass component further includes:
   0.1-16 mole % BaO, and
   0.1-16 mole % MgO.

3. The semiconductor device according to claim 2, wherein the glass component further includes:
   0.1-16 mole % (CaO+SrO), and
   $(B_2O_3+SiO_2) \leq 54$ mole %.

4. The semiconductor device according to claim 1, wherein the glass component further includes:
   0.1-15 mole % $La_2O_3$, and
   0.2-42 mole % $(B_2O_3+Al_2O_3)$.

5. The semiconductor device according to claim 1, wherein the glass component includes:
5-18 mole % $Bi_2O_3$,
21-45 mole % ZnO,
1.5-23 mole % $B_2O_3$,
0.1-12 mole % $Al_2O_3$,
1.5-36 mole % total $R_2O_3$, and
25-48 mole % $SiO_2$.

6. The semiconductor device according to claim 1, wherein the glass component is free of color producing transition metal ions of V, Fe, Co, Ni, Cr, Cu, and Mn.

7. The semiconductor device according to claim 6, wherein the glass component further includes:
0.1-6 mole % BaO, and
0.1-12 mole % MgO.

8. The semiconductor device according to claim 1, wherein the glass component includes:
5-15 mole % $Bi_2O_3$,
25-43 mole % ZnO,
0.1-10 mole % $B_2O_3$,
5-12 mole % $Al_2O_3$,
1.5-36 mole % total $R_2O_3$, and
30-48 mole % $SiO_2$.

9. The semiconductor device according to claim 8, wherein the glass component includes 0.1-5 mole % $B_2O_3$.

10. The semiconductor device according to claim 8, wherein the glass component is free of color producing transition metal ions of V, Fe, Co, Ni, Cr, Cu, and Mn.

11. The semiconductor device according to claim 8, wherein the glass component further includes:
0.1-2 mole % BaO, and
5-12 mole % MgO.

12. The semiconductor device according to claim 8, wherein $(B_2O_3+SiO_2) \leq 54$ mole %.

13. The semiconductor device according to claim 1, wherein the glass component has the following ranges of molar ratios of oxides:
$(B_2O_3+Al_2O_3)/SiO_2 = 0.1$ to 9.0;
$(B_2O_3+Al_2O_3)/ZnO \leq 5.0$; and
$R_2O_3/SiO_2 = 0.1\text{-}15$.

14. The semiconductor device according to claim 13, wherein the molar ratio of $(B_2O_3+Al_2O_3)/ZnO$ is less than or equal to 3.0.

15. The semiconductor device according to claim 13, wherein:
$(B_2O_3+Al_2O_3)/SiO_2 = 0.1$ to 1.2;
$(B_2O_3+Al_2O_3)/ZnO \leq 2.0$; and
$R_2O_3/SiO_2 = 0.1\text{-}2.0$.

16. The semiconductor device according to claim 1, wherein the glass component comprises at least a first glass frit comprising 10-42 mole % $B_2O_3$, and a second glass frit including 0-10 mole % $B_2O_3$, such that the total amount of $B_2O_3$ in the glass component is within the range of 0.1-43 mole %.

17. The semiconductor device according to claim 1, wherein the fired passivation glass layer includes non-zinc-borate crystals comprising: $ZnAl_2O_4$, $Zn_2SiO_4$, $Mg_2Al_4Si_5O_{18}$, $Zn_2Ti_3O_8$, $ZnTiO_3$, $Al_2SiO_5$, other zinc silicates, other zinc titanates, other silicon zirconates, other aluminum silicates, calcium silicates, or combinations thereof.

18. The semiconductor device according to claim 1, wherein the glass component further comprises 0.1-5 mole % of $TiO_2$, $ZrO_2$, $GeO_2$, $CeO_2$, or combinations thereof.

19. A method of passivating a p-n junction, including:
providing a coating composition including a glass component comprising prior to firing, 5-56 mole % $Bi_2O_3$, 15-60 mole % ZnO, 0.1-43 mole % $B_2O_3$, 0.1-15 mole % $Al_2O_3$, 4-53 mole % SiO2, and 1.5-43 mole % total $R_2O_3$, wherein R represents trivalent ions selected from the group consisting of $B^{3+}$, $Al^{3+}$, $La^{3+}$, $Y^{3+}$, $Ga^{3+}$, $In^{3+}$, $Sc^{3+}$, and lanthanide ions from $Ce^{3+}$ to $Lu^{3+}$, and excluding color producing transition metal ions of $Mn^{3+}$, $Fe^{3+}$, $Cr^{3+}$, $V^{3+}$, $Co^{3+}$;
applying the coating composition to a periphery of a p-n junction; and
firing the coating composition to thereby form a fired passivation glass layer on the periphery of the p-n junction.

20. The method according to claim 19, wherein the glass component is a mixture of at least two glasses.

* * * * *